United States Patent [19]
Aytac

[11] Patent Number: 4,518,875
[45] Date of Patent: May 21, 1985

[54] THREE-LEVEL MOS LOGIC CIRCUIT

[76] Inventor: Haluk M. Aytac, P.O. Box 10117, Berkeley, Calif. 94709

[21] Appl. No.: 534,269

[22] Filed: Sep. 22, 1983

Related U.S. Application Data

[63] Continuation-in-part of Ser. No. 385,072, Jun. 4, 1982, abandoned.

[51] Int. Cl.³ .................. H03K 19/20; H03K 19/094
[52] U.S. Cl. .................................... 307/473; 307/451
[58] Field of Search ............... 307/451, 448, 464, 473, 307/474; 364/716

[56] References Cited

U.S. PATENT DOCUMENTS

| | | | |
|---|---|---|---|
| 3,949,242 | 4/1976 | Hirasawa et al. | 307/473 |
| 3,950,656 | 4/1976 | Sumida et al. | 307/473 X |
| 3,969,633 | 7/1976 | Paluck et al. | 307/473 |
| 4,029,971 | 6/1977 | Pryor | 307/473 |
| 4,037,114 | 7/1977 | Stewart et al. | 307/473 |
| 4,202,044 | 5/1980 | Beilstein, Jr. et al. | 307/474 X |
| 4,217,502 | 8/1980 | Suzuki et al. | 307/473 |
| 4,280,065 | 7/1981 | Minato et al. | 307/473 |
| 4,302,690 | 11/1981 | Gollinger et al. | 307/473 X |
| 4,350,906 | 9/1982 | Gillberg | 307/473 X |

FOREIGN PATENT DOCUMENTS 1563821  4/1980  United Kingdom ............... 307/473

OTHER PUBLICATIONS

Dansky, "Multiple Threshold IGFET Ternary Circuits", IBM Tech. Disc. Bull., vol. 17, No. 5, Oct. 1974, pp. 1356-1357.
Smith, "The Prospects for Multivalued Logic: A Technology and Applications View", IEEE Transactions on Computers, vol. C-30, No. 9, Sep. 1981, pp. 619-634.

Primary Examiner—Stanley D. Miller
Assistant Examiner—David R. Hudspeth
Attorney, Agent, or Firm—Owen, Wickersham & Erickson

[57]  ABSTRACT

A ternary logic circuit comprises a load element connected to one voltage level and to a node and a logic section connected to a second voltage level and the same node from which the circuit output is derived. The two voltage levels including the voltage supply and ground voltage enable the circuit to provide an output at three logic levels, "0", "1", and "2", depending on inputs to the logic section. The circuit may be implemented with CMOS technology using, in addition, N-channel or P-channel depletion devices, in different logic formats such as ternary extensions of NAND or NOR gate circuits with the logic section elements arranged in different configurations and combinations of pairs of CMOS devices.

8 Claims, 16 Drawing Figures

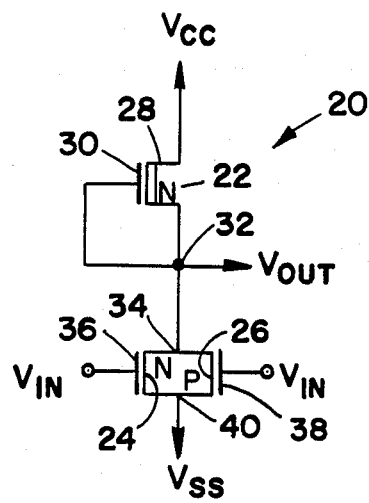
FIG_1
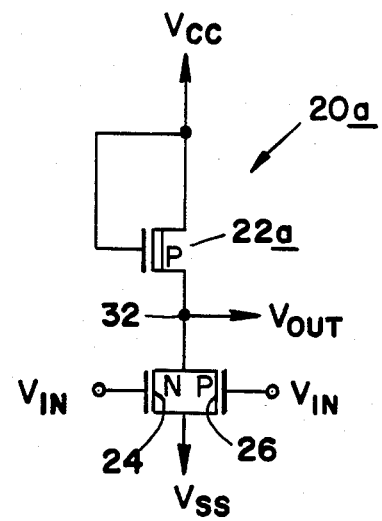
FIG_2
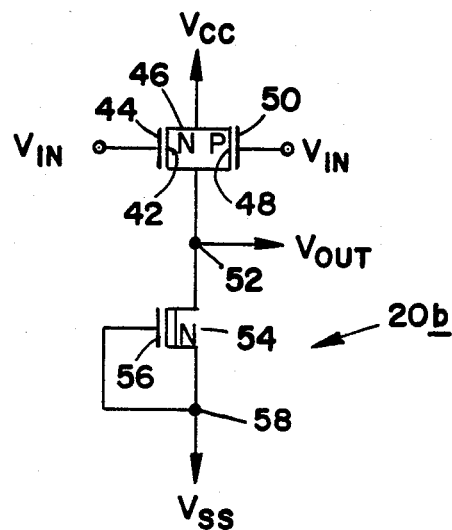
FIG_3
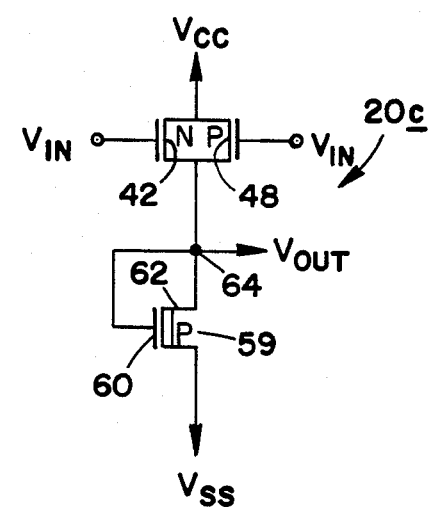
FIG_4

FIG. 12

| LOGIC TABLE | CIRCUIT |
|---|---|
| A | 1 3 5 |
| B | 2 4 7 9 |
| C | 6 8 20 |
| D | 13 14 15 11 22 |
| E | 10 |
| F | 17 21 23 |
| G | 12 16 18 19 24 |

FIG. 13

THREE-LEVEL MOS LOGIC CIRCUIT

CROSS-REFERENCE TO RELATED APPLICATION

This is a continuation-in-part of application Ser. No. 385,072, filed June 4, 1982, now abandoned.

BACKGROUND OF THE INVENTION

This invention relates generally to ternary logic integrated circuits and more particularly to such logic circuits utilizing N-channel or P-channel depletion devices along with complementary MOS devices.

In the development and improvement of intergrated circuit semiconductor devices, a constant objective has been and continues to be that of reducing the overall area on a so-called semiconductor "chip" required for a circuit. Heretofore, this objective included attempts to improve fabrication processes as well as the internal arrangements of the individual circuit elements. The application of ternary, or three level logic circuitry, has been considered as affording at least a partial solution to the problem of minimizing circuit area because it created the possibility of using more efficient interconnections within a circuit. For example, in a ternary system, each data line could carry three possible pieces of information rather than two and the control lines could carry two possible pieces of control information rather than one. Thus, the area required for data and control lines could be substantially reduced.

The multivalued logic circuits previously considered by those versed in the art may be found in IEEE Transactions on Computers, vol. c 30, No. 9, September 1981, p. 619, "The Prospects for Multivalued Logic: A Technology and Applications View", by K. C. Smith. The multivalued logic circuits disclosed in the aforesaid article, at most, transform three separate ternary input values into either three separate ternary output values where one such value is equal to the input value causing it or two separate ternary output values out of a possible set of three values or into a pair of binary output values. Saturated N-channel enhancement devices with appropriately large thresholds were used to create the "one" logic value and these may also be used with the present invention. However, in the aforesaid prior art circuits, there were only two ternary levels of outputs out of a possible three or a pair of binary outputs or where there were three ternary outputs, one equalled the input causing it. This provided only limited utility for complete ternary logic and/or simply transformed ternary signals into binary signals to communicate with the binary world and to compute in binary to get back to ternary in the end. The present invention provides much greater flexibility of complete ternary logic circuit, wherein each input value may go into a different output value and all three ternary levels may be obtained as outputs on a circuit. Also included in the prior art are numerous patents which utilize variations of multivalued circuit inputs or outputs, such as two binary inputs and three voltage supplies (shown in U.S. Pat. No. 3,949,242), or a single input converter with three output states, one of which is of high impedance and not active (shown in U.S. Pat. No. 4,217,502), or a tristate driver circuit wherein the third state is high impedance and not active (shown in U.S. Pat. Nos. 4,280,065; 4,037,114 and 4,029,971). Despite the aforesaid prior activity, applicant is unaware of any disclosure wherein three-level logic inputs produce three-level active logic outputs, where each output is different in logic value than the input logic value causing it, in an integrated circuit device.

It is, therefore a general object of the present invention to provide such a logic circuit with a three-level input and output which is adaptable for implementation as an integrated semiconductor device naturally imbedded into a mixed (i.e., including N or P-channel depletion devices) CMOS technology.

Another object of the invention is to provide a three-level logic circuit as a building block for integrated systems that have a substantially smaller area and package pin count than a comparable device using convention two-level logic.

Yet another object of the invention is to provide a three-level logic circuit that enables each data line to carry three pieces of information and each control line to carry two pieces of information, threreby allowing the area on an integrated circuit "chip" that is normally required for data and control lines to be reduced.

Still another object of the invention is to provide a three-level logic circuit wherein each input value to the circuit results in an output with another logic value and all three levels are achieved as outputs.

SUMMARY OF INVENTION

In accordance with the principles of the invention, a circuit comprises a load element connected to one voltage level and to a node and a logic section connected to a second voltage level and the same node from which the circuit output is provided. The two voltage levels, voltage supply (Vcc) and ground voltage (Vss) enable the circuit to provide an output (Vout) at three logic levels "0", "1" and "2", depending on the inputs to the logic section. The latter comprises at least one pair of complementary N and P-type MOS devices whose gates are connected to the logic input signal(s). The logic section may be provided in various forms including a single pair of complementary MOS devices, two or more pairs of complementary MOS devices in series or separate pairs of complementary MOS devices connected individually to the output. In each modification the resulting logic table for the circuit is different. There is a method to determine the allowable threshold values that provide meaningful ternary logic levels.

The ternary circuits and the logic format according to the present invention are extensions of binary circuits and their logic as exemplified by the inverter circuit, a well known basic element of binary logic integrated semiconductor circuit technology which may be implemented in various semiconductor technologies, e.g., CMOS, PMOS, NMOS.

In the present invention the extensions of this basic inverter circuit for ternary logic integrated semiconductor circuits is implemented with CMOS technology and, in addition, uses N-channel or P-channel depletion devices.

I prefer to call these new basic circuits the p-permutator and the q-permutator, as explained below:

In mathematics, the permutation group P3 of three objects has 3!=6 elements, given as follows:

$$e = \begin{pmatrix} 0 & 1 & 2 \\ 0 & 1 & 2 \end{pmatrix} \quad p = \begin{pmatrix} 0 & 1 & 2 \\ 1 & 2 & 0 \end{pmatrix} \quad q = \begin{pmatrix} 0 & 1 & 2 \\ 2 & 0 & 1 \end{pmatrix}$$

-continued $$i = \begin{pmatrix} 0 & 1 & 2 \\ 0 & 2 & 1 \end{pmatrix} \quad j = \begin{pmatrix} 0 & 1 & 2 \\ 2 & 1 & 0 \end{pmatrix} \quad k = \begin{pmatrix} 0 & 1 & 2 \\ 1 & 0 & 2 \end{pmatrix}$$

Each element changes (permutes) the upper row of elements into the lower row of elements. What I call p- and q-permutators correspond to the elements p and q of the group P3.

The numerals 0, 1, 2 correspond to voltage levels in increasing values, "0" being closest to ground; "2" being closest to power supply voltage; and "1" being a voltage range in between.

The basic inverter mentioned above is a member of the group P2, the permutation group of two objects. This group has 2!=2 elements, the inverter and the identity:

$$\text{identity} = \begin{pmatrix} 0 & 2 \\ 0 & 2 \end{pmatrix} \quad \text{Inverter} = \begin{pmatrix} 0 & 2 \\ 2 & 0 \end{pmatrix}$$

The numerals 0, 2 correspond to "0" and "2" as defined in previous paragraphs.

The word "permutator" is not listed in the Oxford English Dictionary, however, "permutation" is defined as: "The action of changing the order of a set of things linearly arranged. Each of the different arrangements of which such a set is capable."

Van Nostrand's Scientific Encyclopedia defines permutation as: "Given distinguishable objects each different arrangements of the objects is a permutation."

I have coined the word "permutator" for use with the present invention to point out the similarity with the "inverter". Thus, it will be now apparent why the inverter has two extensions in ternary logic: The group P3 has two cyclic permutations that transform each object into a different one, i.e., p and q; i, j, k each keep one object constant. The group P2 has only one cyclic permutation, namely the inverter.

In the embodiments described hereafter, either the p- or q-permutator may be the basis for a ternary logic family, i.e., the extensions of NAND or NOR gate circuits, etc., of binary logic for ternary logic.

Other objects, advantages and features of the invention will become apparent from the following detailed description presented in conjunction with the accompanying drawings:

BRIEF DESCRIPTION OF DRAWINGS

FIG. 1 is a p-permutator circuit embodying the principles of the present invention;

FIG. 2 is a modified form of the circuit of FIG. 1;

FIG. 3 is a q-permutator circuit embodying the principles of the invention;

FIG. 4 is a modified form of the circuit of FIG. 3;

FIG. 12 shows the logic tables related to the circuits of FIG. 11;

FIG. 13 is the correspondence between circuits of FIG. 11 and the logic tables of FIG. 12;

DETAILED DESCRIPTION OF EMBODIMENTS

Figure 5:
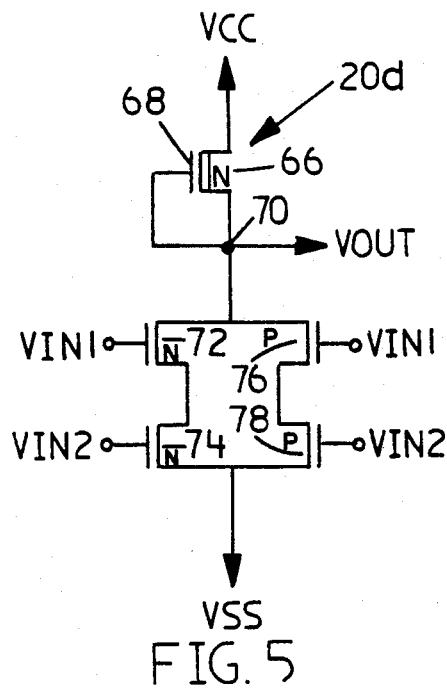
FIG. 5 is a two logic input circuit according to the present invention; it is derived from the p-permutator.

With reference to the drawings, FIG. 1 shows a p-permutator circuit 20 embodying the principles of the present invention.

The circuit 20 is comprised of three MOS elements 22, 24, and 26, which may readily be fabricated as an integrated circuit semiconductor device. In this embodiment, the element 22 is an N-channel depletion mode MOS device whose drain 28 is connected to the supply voltage Vcc (e.g., 5 volts) and its gate 30 is connected to its source at a node 32. The device 24 is an N-channel enhancement mode MOS device whose drain at a node 34 is connected to the node 32 and thus, to the source of device 22. The output (Vout) of the circuit is also provided at node 32. The gate 36 of device 24 is connected to the input data source (Vin) and also to the gate 38 of the device 26 which is a complementary P-channel enhancement mode MOS device. This device is structured as in a CMOS technology, i.e., the substrate voltage for this device is Vcc or greater. The same is true for all P-channel devices described henceforth. The source of device 24 is connected from a node 40 to the ground voltage (Vss) which is nominally at ground or zero voltage level. The drain of device 26 is also connected to node 34 and thus, to the output node 32 and its source is connected to node 40 and thus, to Vss. Devices 22 and 24 have their substrate voltages at Vss or less. The same is true of all N-channel devices described henceforth.

In the operation of circuit 20, when Vin is within the "0" voltage range, then device 24 is "off" and device 26 is "on" and saturated. Vout is the sum of the threshold voltage of device 26, the voltage drop due to current conduction within device 26 and a voltage drop proportional to the "0" voltage level being input to the circuit. The threshold values, the width over length ratios (W/L) and other parameters of the MOS devices are arranged so that this Vout is within the "1" voltage range. When Vin is within the "1" voltage range, then device 24 is still "off" and device 26 is either "off" or close to being so. Vout is now within the "2" voltage range. When Vin is within the "2" voltage range, then device 24 is "on" and pulls the output strongly low. Thus Vout is within the "0" voltage range. All p-permutator derived circuits described henceforth may be made compatible with the p-permutator by only changing the W/L ratios of the relevant devices. Summarizing, the logic table for circuit 20 is as follows:

| Vin | Vout |
|---|---|
| 0 | 1 |
| 1 | 2 |
| 2 | 0 | where 0, 1, 2 denote the voltage ranges "0", "1" and "2". The same meanings will hold true for all subsequent logic tables. In FIG. 2, a modified circuit 20a is shown wherein a first MOS device 22a has its gate connected to its drain, and consequently, to the supply voltage Vcc (instead of to its source). This is a P-channel depletion device with a substrate voltage of Vcc or greater. In all other respects, including its operation, the circuit 20a is the same as circuit 20.

In the modified circuit 20b of FIG. 3, the positions of the three MOS devices are reversed from what they are in circuit 20. Here, an N-channel enhancement mode MOS device 42 has its gate 44 connected to the input source (Vin) and its drain connected to a node 46 which is also connected to the supply voltage Vcc. A complementary P-channel enhancement mode MOS device 48 has its gate 50 connected to the gate 44 of device 42, its drain connected to node 46 and thus, to Vcc. The source terminals for both devices 42 and 48 are connected to a node 52, which is connected to an output (Vout) and also to the drain of a third device 54, the latter being an N-channel depletion MOS device whose gate 56 and source 58 are both connected to Vss. The logic table for the circuit of FIG. 3 is:

| Vin | Vout |
|---|---|
| 0 | 2 |
| 1 | 0 |
| 2 | 1 |

In the operation of circuit 20b, when Vin is within the "0" voltage range, then device 42 is "off" and device 48 is "on", thereby pulling the output up strongly. Thus Vout is within the "2" voltage range. When Vin is within the "1" voltage range, then device 42 is still "off" or barely "on" and device 48 is now "off". Thus Vout is within the "0" voltage range being pulled low by the depletion device 54. When Vin is within the "2" voltage range, then device 48 is "off" and device 42 is "on" and saturated. Vout is the sum of the following voltages away from Vcc: the threshold voltage of device 42, the voltage drop due to current conduction within device 42, and a voltage drop proportional to the magnitude of the amount the "2" voltage level being input to the circuit is different from Vcc. The threshold values, the width over length ratios (W/L), and other parameters of the MOS devices are arranged so that this Vout is within the "1" voltage range. All q-permutator derived circuits described henceforth may be made compatible with the q-permutator by only changing the W/L ratios of the relevant devices.

As shown in FIG. 4, a circuit 20c similar to the previous circuit may be provided wherein the load device is a P-channel depletion mode MOS device 59. Here, the gate 60 and drain 62 of this device are both connected to the Vout node and to the sources of devices 42 and 48 through a node 64.

In all other respects, including its operation, the circuit 20c is the same as circuit 20b. Henceforth, in the circuits discussed subsequently, only N-channel depletion devices with their gates connected to their sources will be shown as load devices. However, it is understood that P-channel depletion devices with their gates connected to their drains can be used alternatively with no change in the operation or the logic table for the circuit.

In another circuit 20d embodying the principles of the invention, as shown in FIG. 5, two logic inputs are furnished to four input gates. An N-channel depletion MOS device 66 has its drain connected to Vcc supply with its gate 68 and source connected together at a node 70 from which the output Vout is taken.

The logic input portion of the circuit comprises two N-channel enhancement MOS devices 72 and 74 connected in series and two complementary P-channel enhancement MOS devices 76 and 78 also connected in series. The drain of N-channel device 72 and the drain of P-channel device 76 are both connected to the output node 70. The source of device 74 and device 78 are both connected to Vss. The gates of complementary devices 72 and 76 are connected to a first logic input (Vin1) and the gates of devices 74 and 78 are connected to a second logic input (Vin2).

With the two logic inputs Vin1 and Vin2, the circuit 20d provides an extension of the p-permutator into two ternary logic input circuits with a single output line. The operation is an extension of the NAND circuit of binary logic. Binary NAND is an extension of the inverter and for different inputs the output is always a "2" (here, "2", "0" is used for binary logic instead of "1", "0", since in this invention "2" denotes the voltage range closest to Vcc voltage which is what "1" denotes customarily in binary logic.).

For the same inputs the output is the inversion of the input as follows:

| Vin1 | Vin2 | Vout |
|---|---|---|
| 0 | 0 | 2 |
| 0 | 2 | 2 |
| 2 | 0 | 2 |
| 2 | 2 | 0 |

For the circuit of FIG. 5, an extension of the p-permutator for two logic input circuits, the same rule applies when inversion is replaced with p-permutation, thus:

| Vin1 | Vin2 | Vout |
|---|---|---|
| 0 | 0 | 1 |
| 0 | 1 | 2 |
| 0 | 2 | 2 |
| 1 | 0 | 2 |
| 1 | 1 | 2 |
| 1 | 2 | 2 |
| 2 | 0 | 2 |
| 2 | 1 | 2 |
| 2 | 2 | 0 |

The operation of circuit 20d is as follows:

When Vin1 and Vin2 are both within "2" voltage range, then the N-channel enhancement devices in series are both "on" and Vout is within the "0" voltage range.

When Vin1 and Vin2 are both within the "0" voltage range, then the P-channel enhancement device 78 is "on" and saturated and the P-channel enhancement device 76 is "on" and non-saturated. Thus Vout is within the "1" voltage range.

In all other cases, in both of the two chains of transistors in series there is at least one device that is "off" or close to being "off" so that Vout is within the "2" voltage range since device 66 is always "on".

Figure 6:
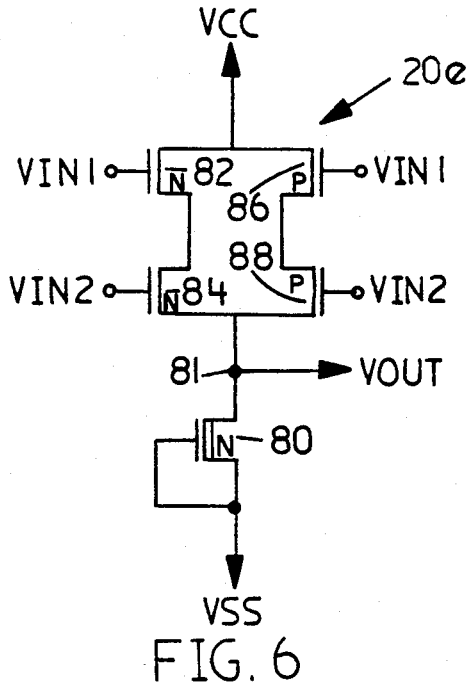
FIG. 6 is a q-permutator derived form of the circuit of FIG. 5.

In FIG. 6, a modified circuit 20e is shown wherein a two logic input logic section is connected to the common power supply Vcc and to an output node 81. A single N-channel depletion type MOS device 80, whose drain is also connected to the output node, has its gate and source connected to Vss. The logic section is comprised of two series connected N-channel enhancement MOS devices 82 and 84 whose gates are connected to logic inputs Vin1 and Vin2 respectively, the drain of device 82 being connected to Vcc and the source of device 84 being connected to the output node 81. Similarly, a pair of complementary P-channel enhancement MOS devices 86 and 88 are connected in series and have gates which are also connected to logic inputs Vin1 and Vin2 respectively, with the drain of device 86 connected to Vcc and the source of device 88 being connected to the output node 81.

With the two logic inputs Vin1 and Vin2 the circuit 20e provides an extension of the q-permutator into two ternary logic input circuits with a single output line. The operation is an extension of the NAND circuit of binary logic in the same fashion as described for circuit 20d. Namely, for like inputs the output is q-permuted and for different input values the output is a logic "0".

Henceforth, we will use the terms logic 0 (or 1 or 2) interchangeably with the terms "0" voltage range (or "1" or "2"). We will also consider Vin, Vin1, Vin2, Vout to mean both a voltage level, or range and a logic value. Thus, the expression Vin1=0 will mean Vin1 is within the "0" voltage range, etc. Similarly, "Vin1 is a logic "0" will also mean Vin1 is within the "0" voltage range.

The logic table for circuit 20e is given below:

| Vin1 | Vin2 | Vout |
|------|------|------|
| 0 | 0 | 2 |
| 0 | 1 | 0 |
| 0 | 2 | 0 |
| 1 | 0 | 0 |
| 1 | 1 | 0 |
| 1 | 2 | 0 |
| 2 | 0 | 0 |
| 2 | 1 | 0 |
| 2 | 2 | 1 |

The operation of circuit 20e is as follows:

When Vin1 and Vin2 are both logic 2, then the N-channel enhancement device 82 is "on" and saturated and N-channel enhancement device 84 is "on" and non-saturated. Thus Vout is a logic 1.

When Vin1=0 and Vin2=0 then the P-channel enhancement devices in series 86 and 88 are both "on" and pull Vout strongly towards Vcc and thus, Vout=2.

In all other cases, in both of the two chains of transistors in series there is at least one device that is "off" or barely "on" so that Vout=0 since device 80 is always "on".

Figure 7:
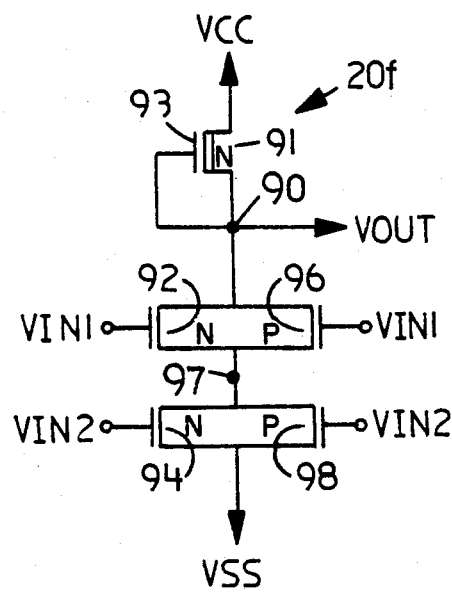
FIG. 7 is another form of two logic input circuit according to the invention; it is also derived from the p-permutator.

FIG. 7 shows a circuit 20f which is another extension on the p-permutator to the two logic input circuits. This circuit has two logic inputs that are furnished to four input gates. An N-channel depletion MOS device 91 has its drain connected to Vcc supply with its gate 93 and source connected together at a node 90 from which the output is taken.

The logic input portion of the circuit comprises a complementary pair of N-channel enhancement device 92 and P-channel enhancement device 96 whose drains are both connected to node 90 and whose sources are both connected to node 97 and another complementary pair of N-channel enhancement device 94 and P-channel enhancement device 98 whose drains are both connected to node 97 and whose sources are both connected to Vss.

The gates of complementary devices 92 and 96 are connected to a first logic input (Vin1) and the gates of devices 94 and 98 are connected to a second logic input (Vin2).

In the operation of circuit 20f, when one of the inputs to either of the two complementary pairs of devices in the logic section is a logic 1 then the path to ground of node 90 is open or almost open so that Vout=2.

When Vin1=0 then Vout=1 since either Vin 2=2, in which case the P-channel device in the complementary pair with input of logic 0 is "on" and saturated and the N-channel device in the other pair is "on" and non-saturated, or Vin2=0 in which case the P-channel device in the pair whose sources are connected to Vss is "on" and saturated and the P-channel device in the other pair is also "on" and non-saturated. When Vin1=2 and Vin2=0, the P-channel device in the pair whose sources are connected to Vss is "on" and saturated and the N-channel device in the other pair is "off" or almost "off" because its source is at 1 level and 1 level plus Vtne is about equal to the 2 level so that there is not enough overdrive left, thus Vout=2. Here Vtne denotes the threshold voltage of the N-channel enhancement device. In the remaining case Vin1 and Vin2 are both logic 2 and Vout=0 since both N-channel enhancement devices are "on".

The logic table for circuit 20f is provided below:

| Vin1 | Vin2 | Vout |
|------|------|------|
| 0 | 0 | 2 |
| 0 | 1 | 2 |
| 0 | 2 | 1 |
| 1 | 0 | 2 |
| 1 | 1 | 2 |
| 1 | 2 | 2 |
| 2 | 0 | 1 |
| 2 | 1 | 2 |
| 2 | 2 | 0 |

This is another extension of the NAND of binary circuits.

Figure 8:
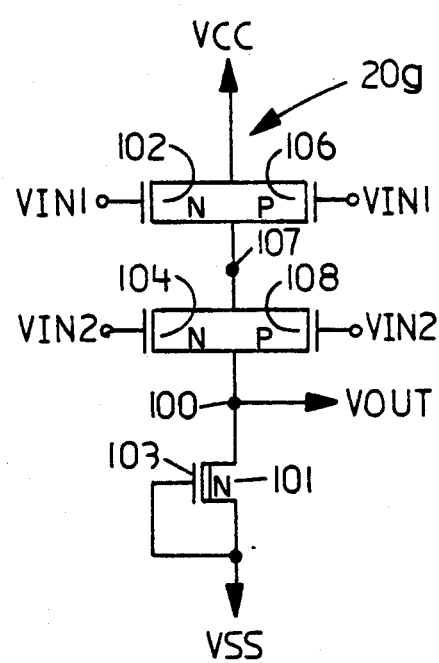
FIG. 8 is a q-permutator derived form of the circuit of FIG. 7.

FIG. 8 shows a circuit 20g which is similar to circuit 20f in FIG. 7 except that it is an extension of the q-permutator. Thus, in FIG. 8, a two logic input logic section is connected to the common power supply Vcc and to an output node 100. A single N-channel depletion type MOS device 101, where drain is also connected to the output node, has its gate and source connected to Vss.

The logic input portion of the circuit comprises a complementary pair of N-channel enhancement device 102 and P-channel enhancement device 106 whose drains are both connected to Vcc and whose sources are both connected to node 107 and another complementary pair of N-channel enhancement device 104 and P-channel enhancement device 108 whose drains are both connected to node 107 and whose sources are both connected to the output node 100.

The gates of complementary devices 102 and 106 are connected to a first logic input (Vin1) and the gates of devices 104 and 108 are connected to a second logic input (Vin2).

In the operation of circuit 20g, when one of the inputs to either of the two complementary pairs of devices in the logic section is a logic 1 then the path to Vcc of node 100 is open or almost open so that Vout=0.

When Vin2=2 then Vout=1 since either Vin1=0, in which case the N-channel device in the complementary pair with input of logic 2 is "on" and saturated and the P-channel device in the other pair is "on" and non-saturated, or Vin1=2 in which case the N-channel device in the pair whose drains are connected to Vcc is "on" and saturated and the N-channel device on the other pair is also "on" but non-saturated. When Vin2=0 and Vin1=2, the N-channel device in the pair whose drains are connected to Vcc is "on" and saturated and the P-channel device in the other pair is "off" or almost "off" because its drain is at 1 level and 1 level minus Vtpe is about equal to the 0 level so that there is not enough overdrive left, thus Vout=0. Here, Vtpe denotes the threshold voltage of the P-channel enhancement device. In the remaining case Vin1 and Vin2 are both logic 0 and Vout=2 since both P-channel enhancement devices are "on".

The logic table for circuit 20g is provided below:

| Vin1 | Vin2 | Vout |
|---|---|---|
| 0 | 0 | 2 |
| 0 | 1 | 0 |
| 0 | 2 | 1 |
| 1 | 0 | 0 |
| 1 | 1 | 0 |
| 1 | 2 | 0 |
| 2 | 0 | 0 |
| 2 | 1 | 0 |
| 2 | 2 | 1 |

This is another extension of the NAND of binary circuits for the q-permutator based ternary logic family.

Figure 9:
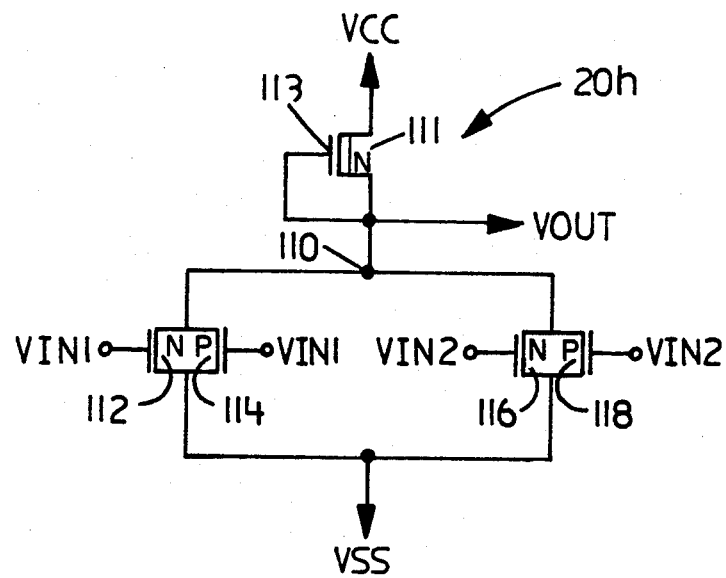
FIG. 9 is another form of a two logic input circuit according to the invention; it is a derivative of the p-permutator.

In another circuit 20h embodying the principles of the invention, as shown in FIG. 9, two logic inputs are furnished to four input gates. An N-channel depletion MOS device 111 has its drain connected to Vcc supply with its gate 113 and source connected together at a node 110 from which the output Vout is taken.

The logic input portion of the circuit comprises a complementary pair of N-channel enhancement MOS device 112 and P-channel enhancement MOS device 114 connected in parallel and another complementary pair of N-channel enhancement MOS device 116 and P-channel enhancement MOS device 118 also connected in parallel. The drains of all four devices 112, 114, 116, 118 are connected to the output node 110. The sources of all four devices 112, 114, 116, 118 are connected to Vss. The gates of complementary devices 112 and 114 are connected to a first logic input (Vin1) and the gates of complementary devices 116 and 118 are connected to a second logic input (Vin2).

With the two logic inputs Vin1 and Vin2 the circuit 20h provides another extension of the p-permutator into the two ternary logic input circuits with a single output line. Its operation is an extension of the NOR circuit of binary logic.

The NOR circuit is an extension of the inverter to two logic input binary circuits and for the same inputs the output is an inversion of the input. For different inputs, the output is a zero as given in the following logic table:

| Vin1 | Vin2 | Vout |
|---|---|---|
| 0 | 0 | 2 |
| 0 | 2 | 0 |
| 2 | 0 | 0 |
| 2 | 2 | 0 |

The circuit 20h, its output twice p-permuted and with the logic truth value assignments:

Probable (P)=0

False (F)=1

True (T)=2 implements the OR truth value table of ternary propositional logic: voltage which is what "1" customarily denotes in binary logic.

For the circuit of FIG. 9, the same rule applies when inversion is replaced with p-permutation. However, this leaves out the case when one input is logic 0 and the other is logic 1. Then the result is a logic 1 as seen below.

| Vin1 | Vin2 | Vout |
|---|---|---|
| 0 | 0 | 1 |
| 0 | 1 | 1 |
| 0 | 2 | 0 |
| 1 | 0 | 1 |
| 1 | 1 | 2 |
| 1 | 2 | 0 |
| 2 | 0 | 0 |
| 2 | 1 | 0 |
| 2 | 2 | 0 |

In the operation of circuit 20h, when Vin1=Vin2, then the situation is the same as a p-permutator and the output is the same as for a p-permutator with the same input. When one of Vin1 or Vin2 is a logic 2 the corresponding N-channel enhancement device is "on" and pulls the output low strongly, thus Vout=0. The case left is when one of Vin1 or Vin2 is a logic 0 and the other is a logic 1. The pair that has logic 0 as input has its P-channel enhancement complementary MOS device "on" and saturated. The pair that has logic 1 as input has both devices "off". Thus, the output will be a logic 1.

With the same logic truth value assignments as in the p-permutator based AND discussed with FIG. 7 above, and p-permuting the output twice, the circuit 20h implements the OR truth value table of ternary propositional logic:

| Proposition 1 | Proposition 2 | Result |
|---|---|---|
| T | T | T |
| T | P | T |
| T | F | T |
| P | T | T |
| P | P | P |
| P | F | P |
| F | T | T |
| F | P | P |
| F | F | F |

With the truth value assignments:

Probable (P)=0

True (T)=1

False (F)=2 circuit 20h, its output permuted twice, implements the AND truth value table of ternary propositional logic:

| Proposition 1 | Proposition 2 | Result |
|---|---|---|
| P | P | P |
| P | T | P |
| P | F | F |
| T | P | P |
| T | T | T |
| T | F | F |
| F | P | F |
| F | T | F |
| F | F | F |

Figure 10:
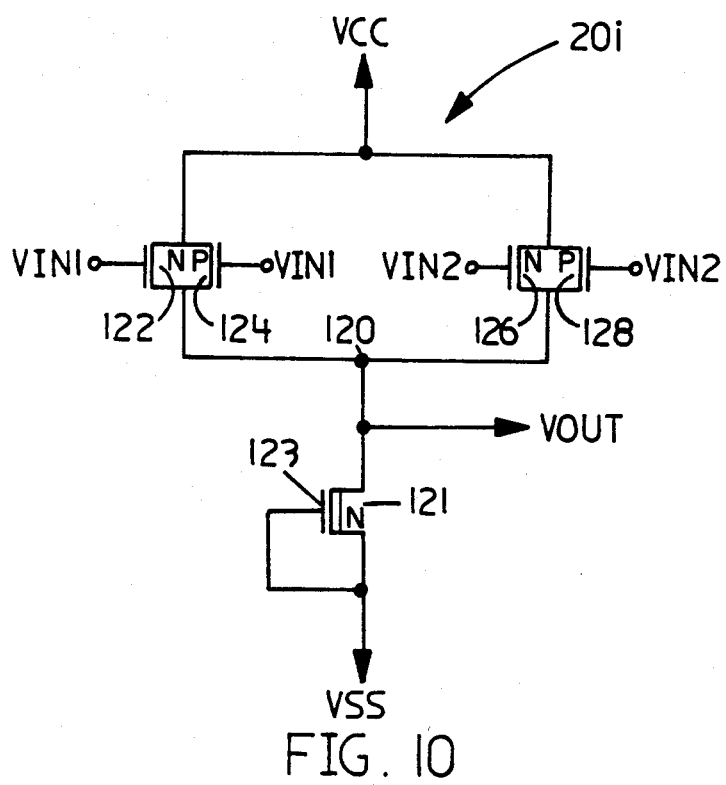
FIG. 10 is a q-permutator derivative form of the circuit of FIG. 9.

In another circuit 20i embodying the principles of the invention, as shown in FIG. 10, a two logic input logic section is connected to the common power supply Vcc and to an output node 120. A single N-channel depletion type MOS device 121, whose drain is also connected to the output node, has its gate and source connected to Vss.

The logic input portion of the circuit comprises a complementary pair of N-channel enhancement MOS device 122 and P-channel enhancement MOS device 124 connected in parallel and another complementary pair of N-channel enhancement MOS device 126 and P-channel enhancement MOS device 128 also connected in parallel. The drains of all four devices 122, 124, 126, and 128, are connected to the power supply Vcc. The sources of all four devices 122, 124, 126, and 128, are connected to the output node 120. The gates of complementary devices 122 and 124 are connected to a first logic input Vin1, and the gates of complementary devices 126 and 128 are connected to a second logic input Vin2.

With the two logic inputs Vin1 and Vin2, the circuit 20i provides another extension of the q-permutator into two ternary logic input circuits with a single output line. Its operation is an extension of the NOR circuit of binary logic.

That is, for like inputs, the output is q-permuted and for the case when one input is a logic 0 the output is a logic 2. For the case when one of Vin1 or Vin2 is a logic 1 and the other is a logic 2, then the output is a logic 1.

The logic table for circuit 20i is given below:

| Vin1 | Vin2 | Vout |
|---|---|---|
| 0 | 0 | 2 |
| 0 | 1 | 2 |
| 0 | 2 | 2 |
| 1 | 0 | 2 |
| 1 | 1 | 0 |
| 1 | 2 | 1 |
| 2 | 0 | 2 |
| 2 | 1 | 1 |
| 2 | 2 | 1 |

In the operation of circuit 20i, when Vin1=Vin2, the situation is the same as a q-permutator and the output is the same as for a q-permutator with the same input. When one of Vin1 or Vin2 is a logic 0, the corresponding P-channel enhancement device is "on" and pulls the output high strongly, thus a logic 2 as output.

The case left is when one of Vin1 or Vin2 is a logic 1 and the other is a logic 2. The pair that has logic 2 as input has its N-channel enhancement MOS device "on" and saturated. The pair that has logic 1 as input has both devices "off". Thus the output will be a logic 1.

The circuit 20i, its output q-permuted twice and with the logic truth value assignments:

True (T)=0

Probable (P)=2

False (F)=1 implements the OR truth value table as shown before, with the assignments:

False (F)=0

True (T)=1

Probable (P)=2 it implements the AND truth value table as shown before.

Figure 11:
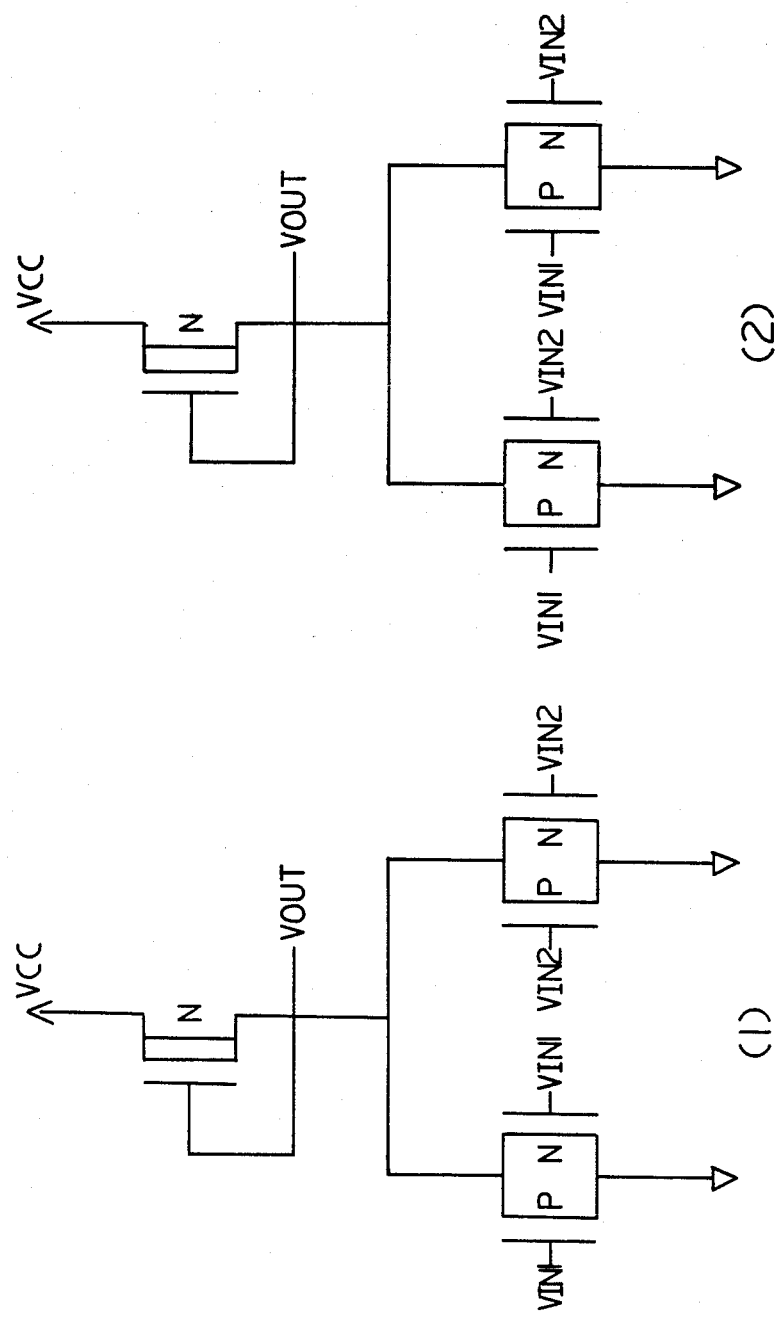
FIG. 11 shows all p-permutator based two input, one output circuits.
Figure 11:
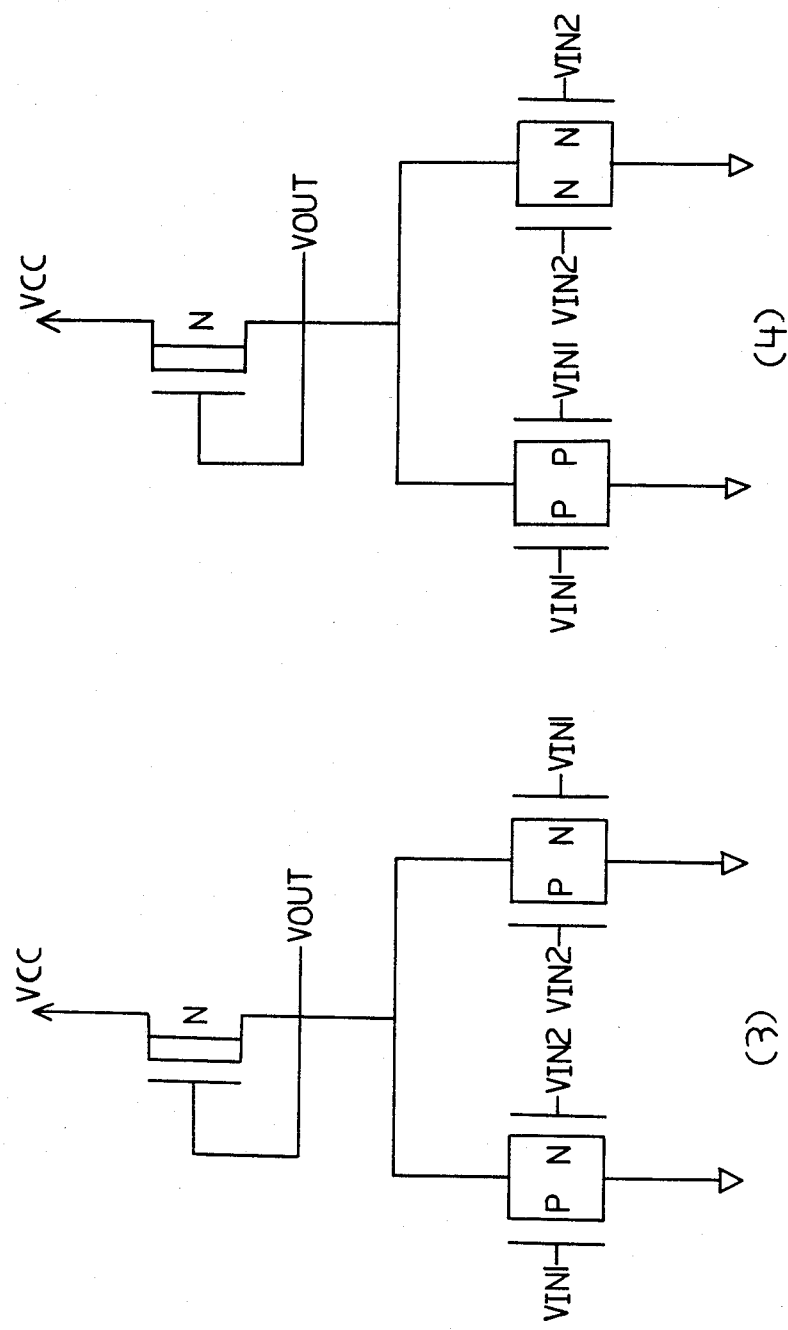
Figure 11:
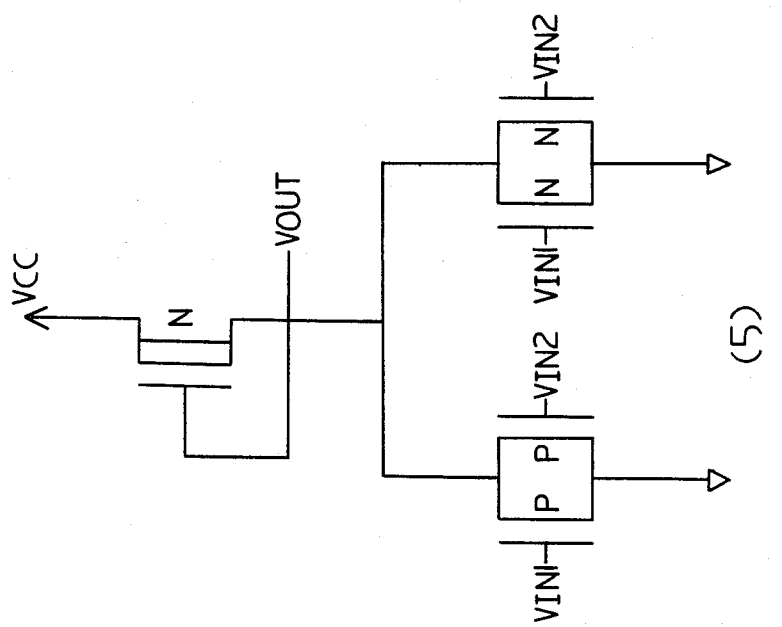
Figure 11:
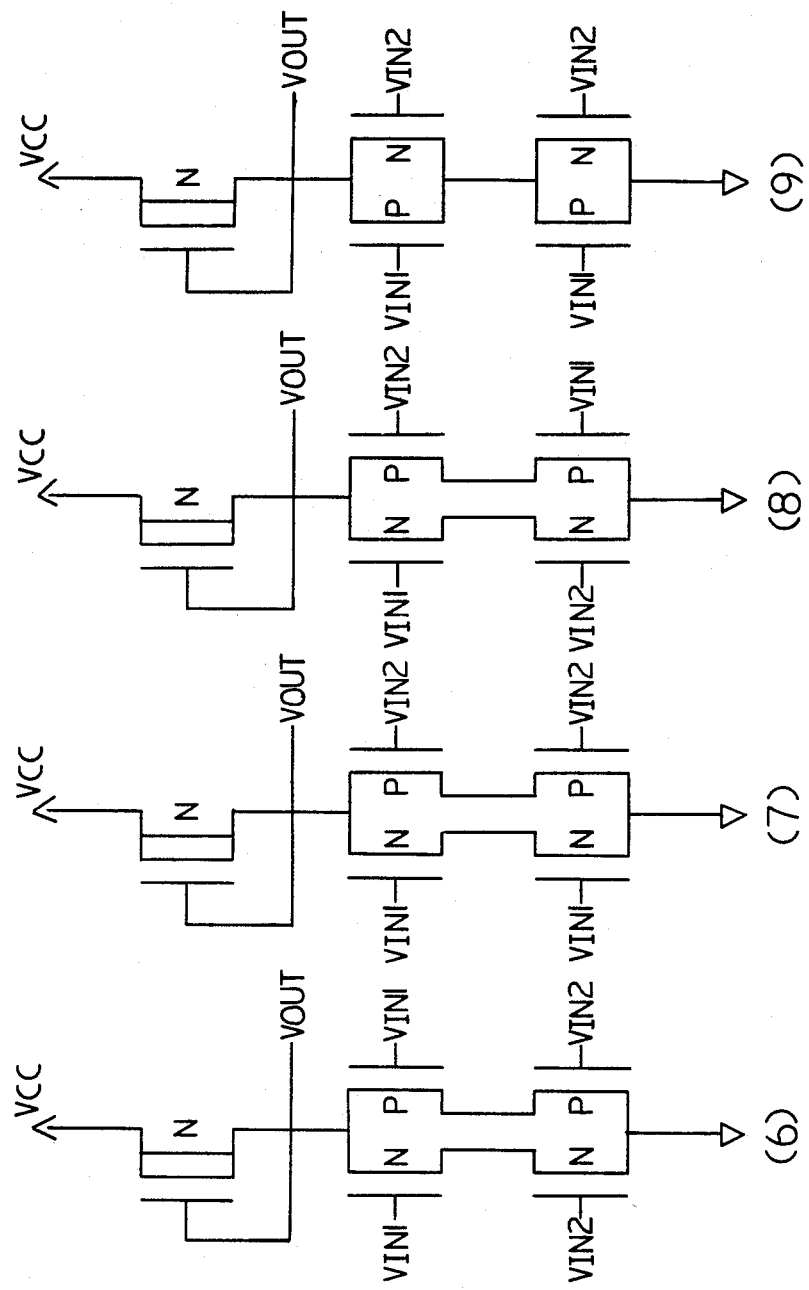
Figure 11:
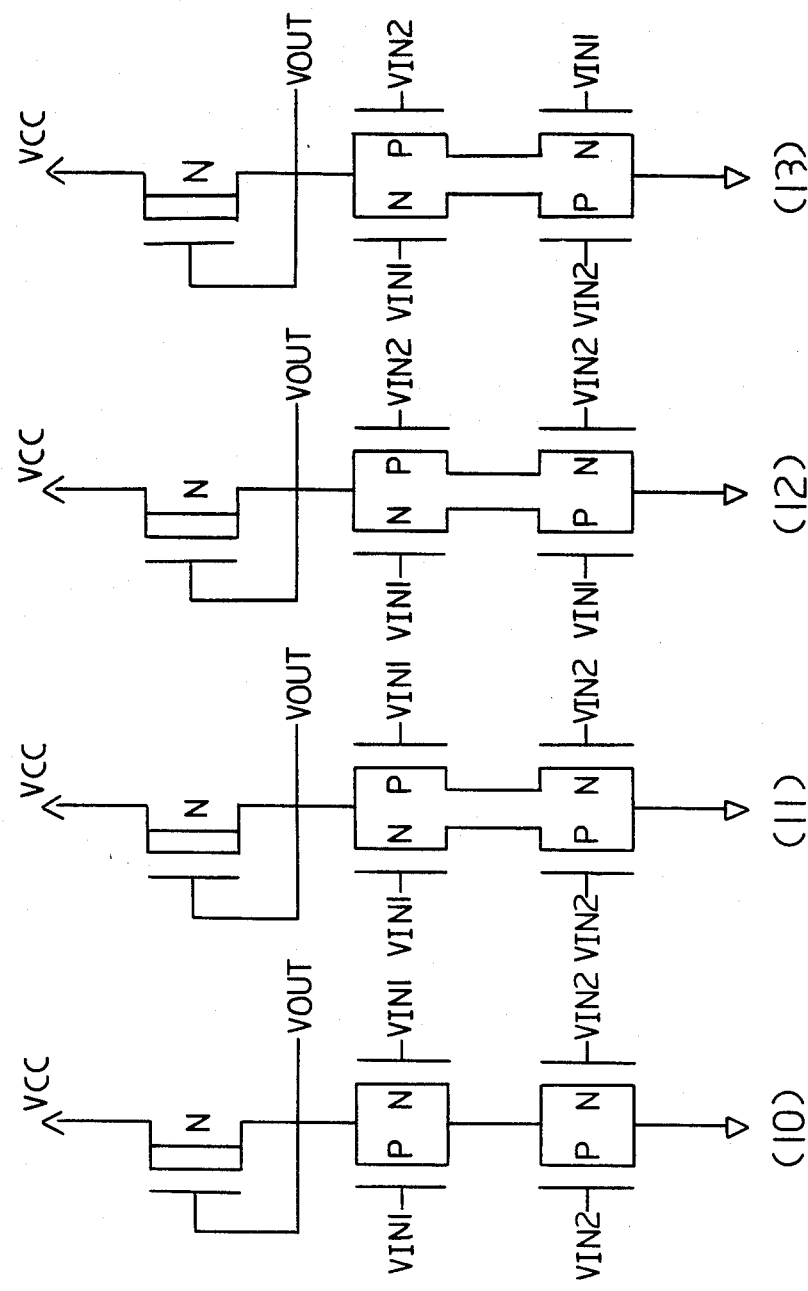
Figure 11:
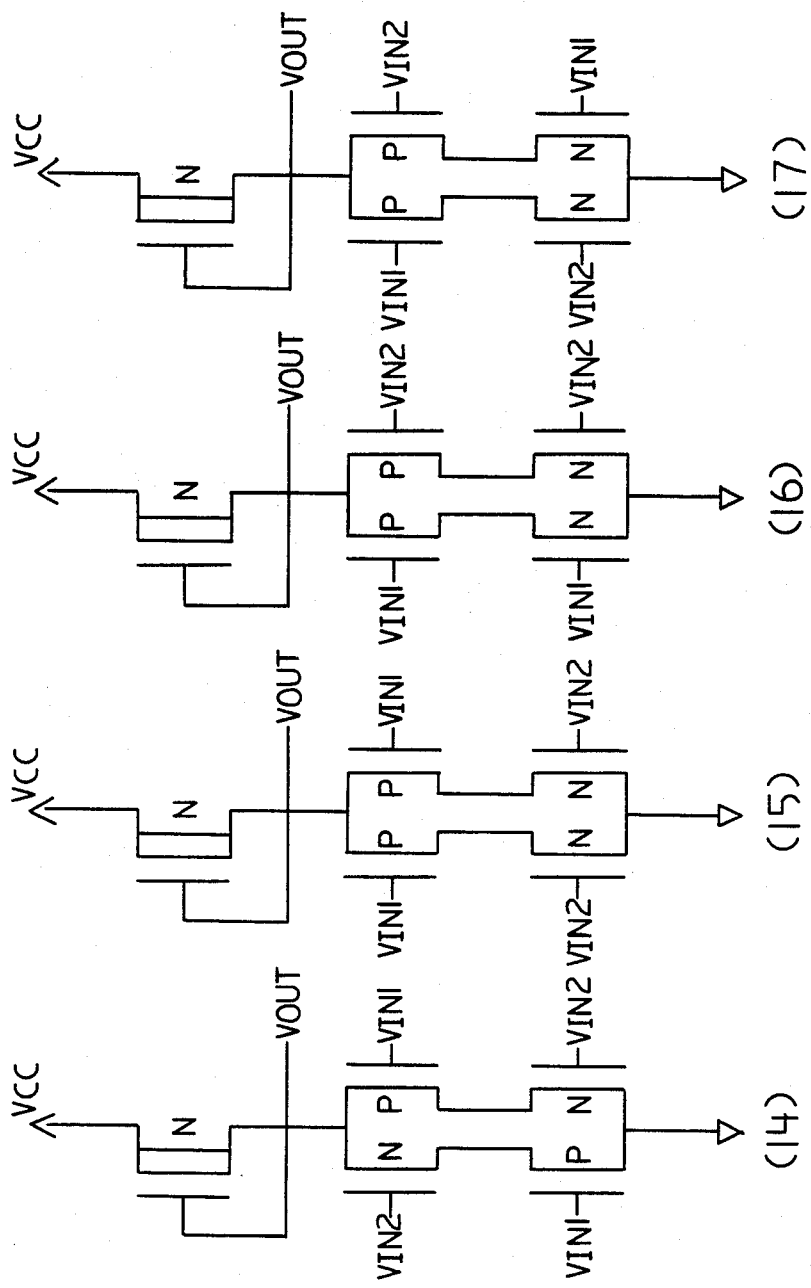
Figure 11:
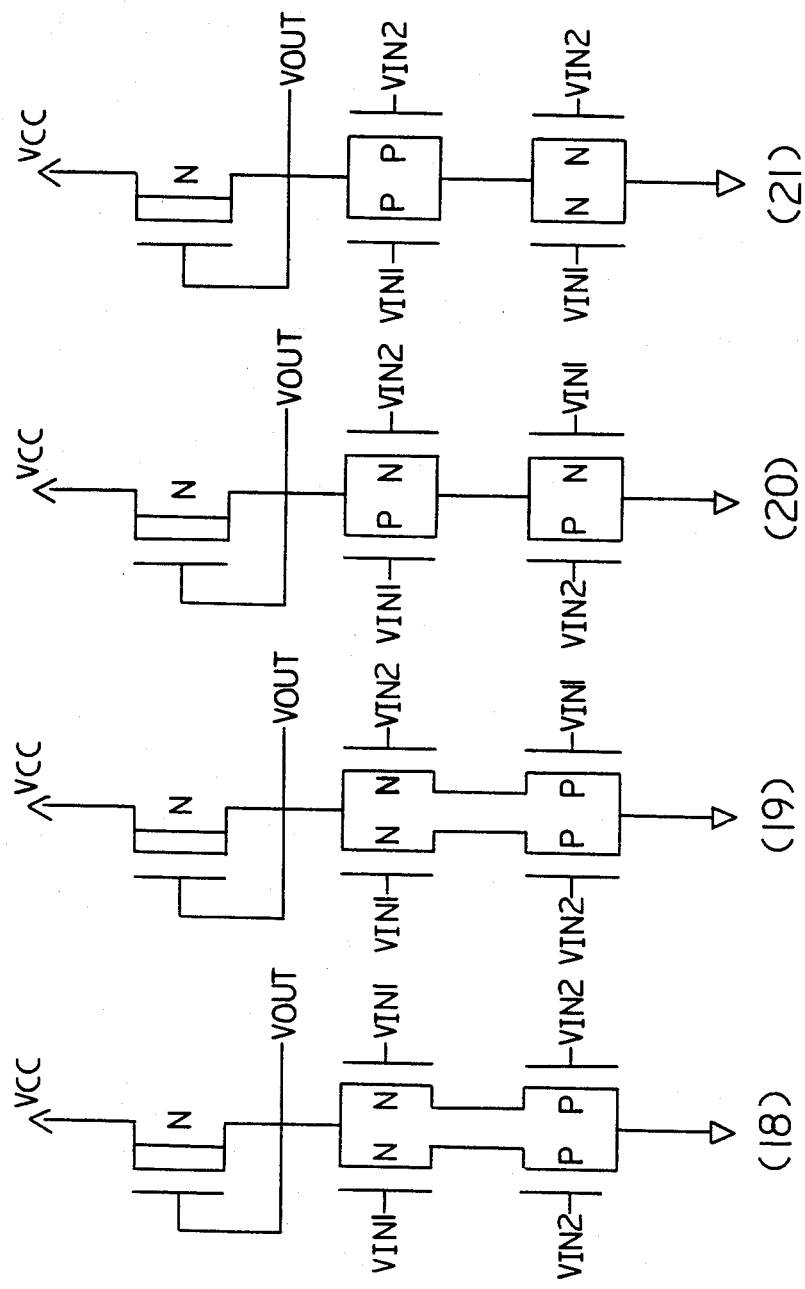
Figure 11:
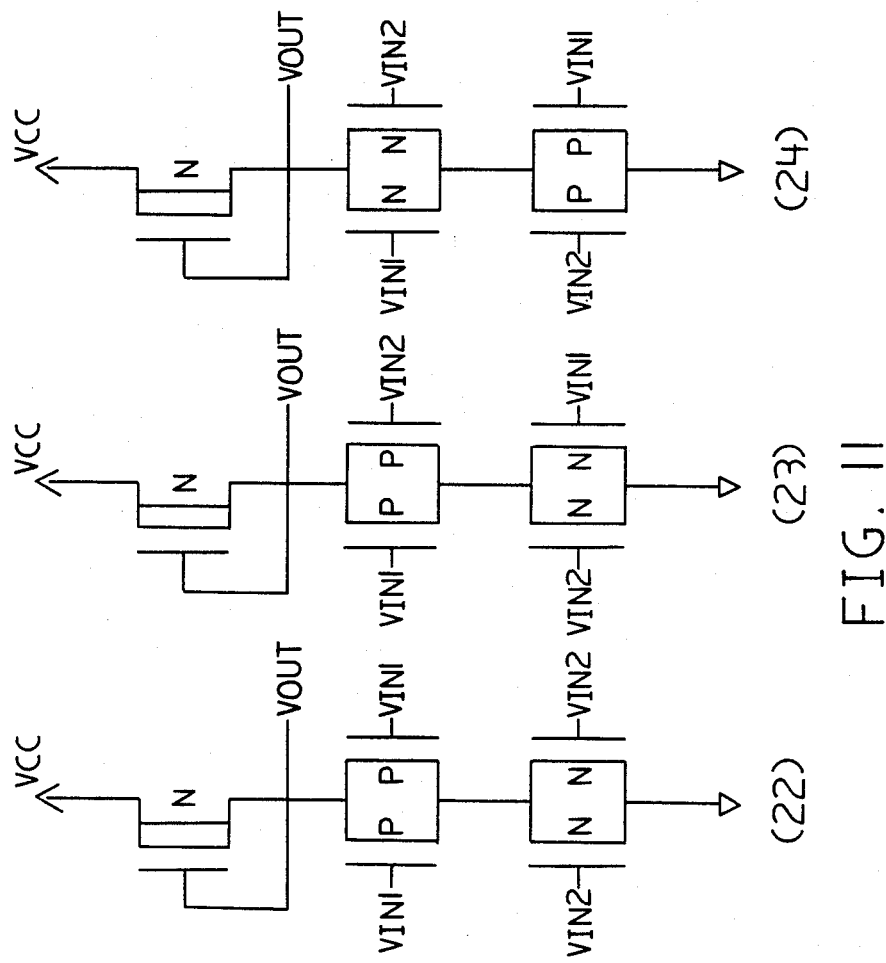
Figure 12:
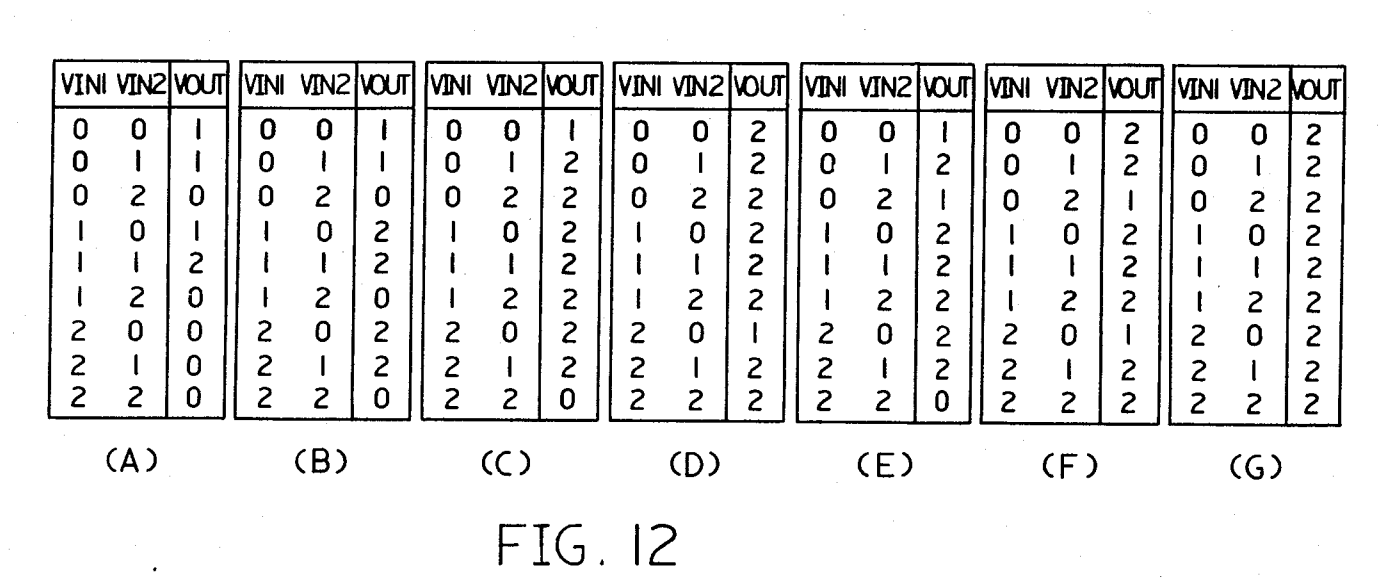

In all there are 24 different p-permutator based two input, one output circuits including the ones discussed above. FIG. 11 shows these circuits numbered 1 to 24. FIG. 12 shows all distinct logic tables arising out of the circuits of FIG. 11. These are labelled a to g in FIG. 12. FIG. 13 shows the correspondence between the circuits of FIG. 11 and the logic tables of FIG. 12. Similarly, the corresponding q-permutator based circuits and their logic tables can be obtained in a straightforward way.

Figure 14:
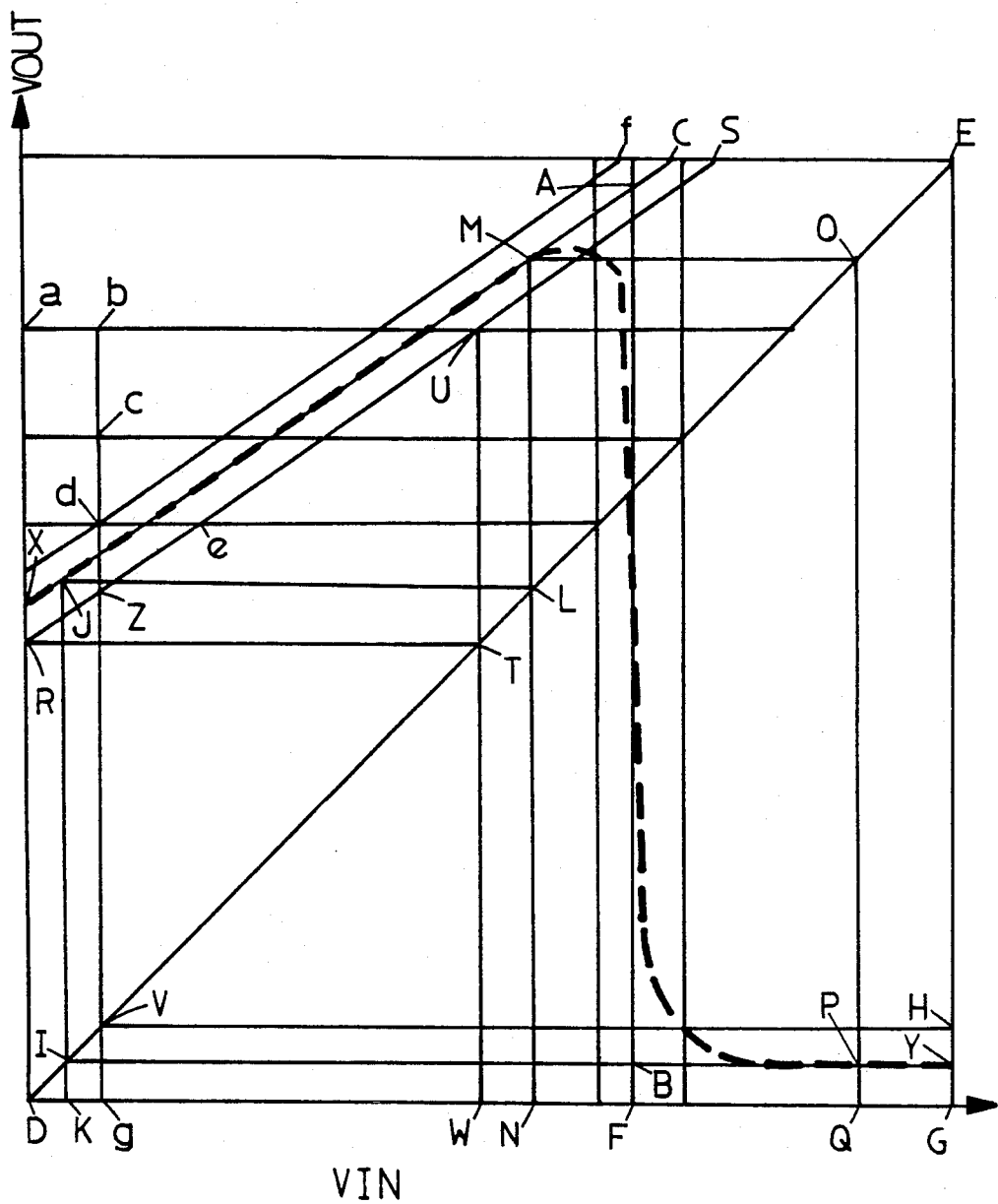
FIG. 14 is the transfer curve for the p-permutator.

FIG. 14 shows the transfer curve for the p-permutator. The actual curve is shown by the dashed curvilinear line XY in the shape of a half dome. It can be abstracted by the broken line XABY. A diagonal DE is provided so that an output level can be transformed into an input level to be fed back in again.

The portion XA is given by the saturated P-channel enhancement device as the voltage sweeps from ground level on. CE is equal in magnitude to Vtpe, the threshold voltage of the P-channel enhancement device. DF equals Vtne, the threshold voltage of the N-channel enhancement device. As Vin approaches the point F the N-channel enhancement device turns "on" and we have the line AB. After F the Vout stays at "0" level which produces the line BY.

Assuming a chain of p-permutators all represented by the dashed transfer curve XY in FIG. 14, when the input is a logic 0, then it will be of magnitude YG. Extending YB to intersect the diagonal DE at I will give the output as the intersection of the vertical from I with XC i.e. the point J. JK is the magnitude of the logic 1 output. It can be fed into the next permutator in the chain by extending the horizontal from J to intersect the diagonal DE at L and extending the vertical from L to intersect XC at M. MN is the magnitude of the logic 2 output. It, in turn can be fed into the next permutator by extending M horizontally to intersect the diagonal DE at 0 and extending 0 vertically to intersect BY at P. PQ is the magnitude of the logic 0 output. With this transfer curve (the dashed XY curve) the polygon PIJLMOP will repeat itself through permutators and the logic levels will be stable.

Not all transfer curves will have this property. Next, we analyze pictorially, using FIG. 14, the requirements for compatible threshold value ranges for meaningful ternary logic operation.

We start with picking a Vtpe minimum value equal to SE. RD is determined by Vtpe minimum added to a voltage drop due to current in the P-channel enhancement device. RD is equal to the minimum "1" level. Extending R horizontally to intersect the diagonal DE at T and extending T vertically to intersect RS at U determines the minimum "2" level as the magnitude of UW.

On the other hand, the maximum "0" level is equal to the magnitude of the line segment HG. Extending H horizontally to intersect the diagonal DE and V and extending V vertically to intersect RS at Z and Ua at b, we have Zb as what is available for N-channel enhancement device minimum overdrive plus Vtne range plus an amount proportional to (but less than) the Vtpe range.

Partitioning Zb, we have bc equal to the minimum overdrive on the N-channel enhancement device when a minimum logic 2 level is applied; cd equal to the range of Vtne; and dZ translating into de as the range of the Vtpe. The magnitude of Vtpe sweeps from SE to fE. The magnitude of Vtne sweeps from dg to cg.

Zb is maximized when points U and S coincide. This occurs when Vtpe minimum is chosen such that:

Vtpe minimum + RD(minimum "1" level) = Vcc.

This can be achieved by proper choice of Vtpe, Vtnd and (W/L)'s for the MOS devices.

Figure 15:
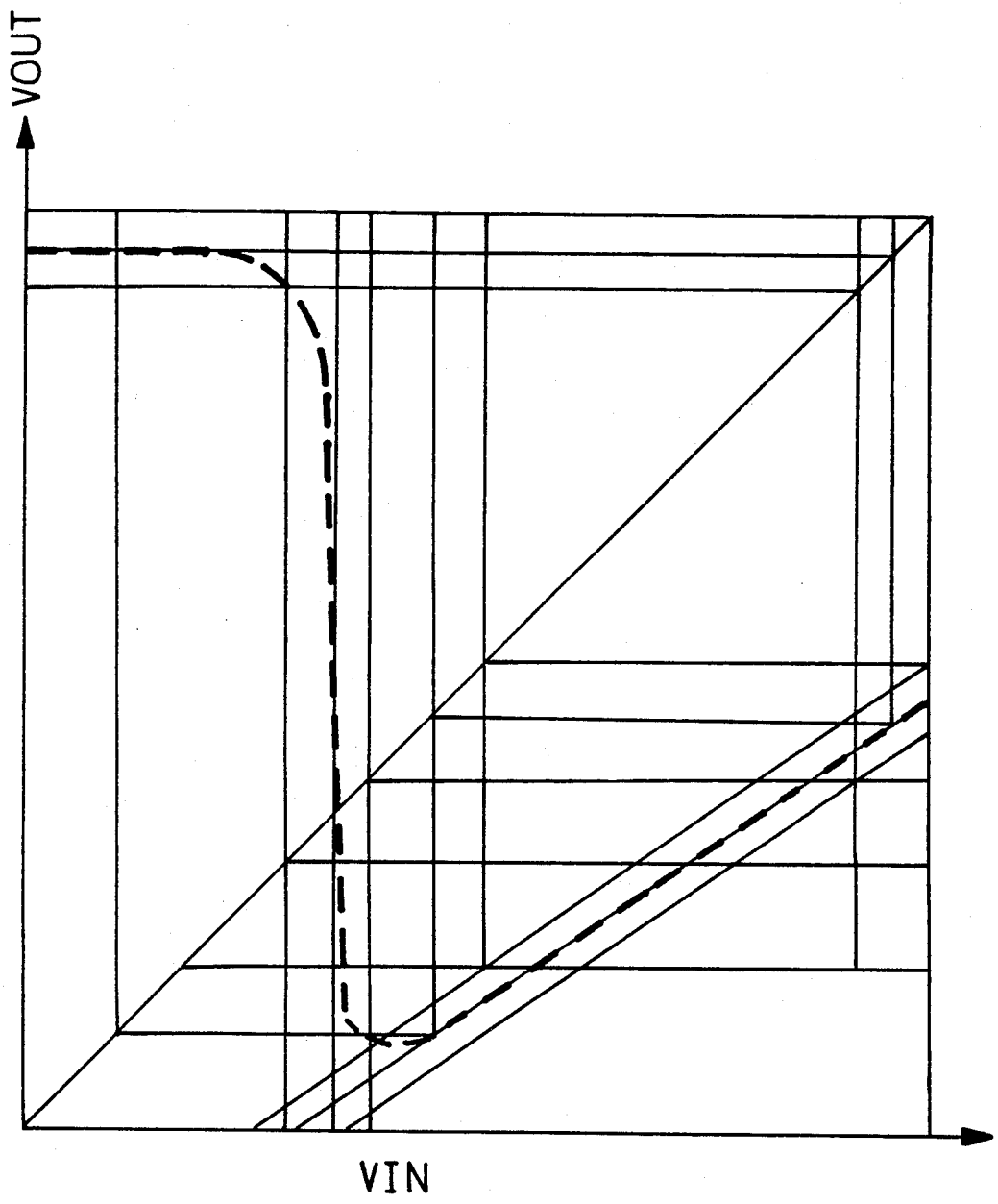
FIG. 15 is the transfer curve for the q-permutator.

FIG. 15 shows the transfer curve for the q-permutator. Similar considerations apply to finding suitable threshold and logic value ranges for meaningful q-permutator based ternary logic.

Figure 16:
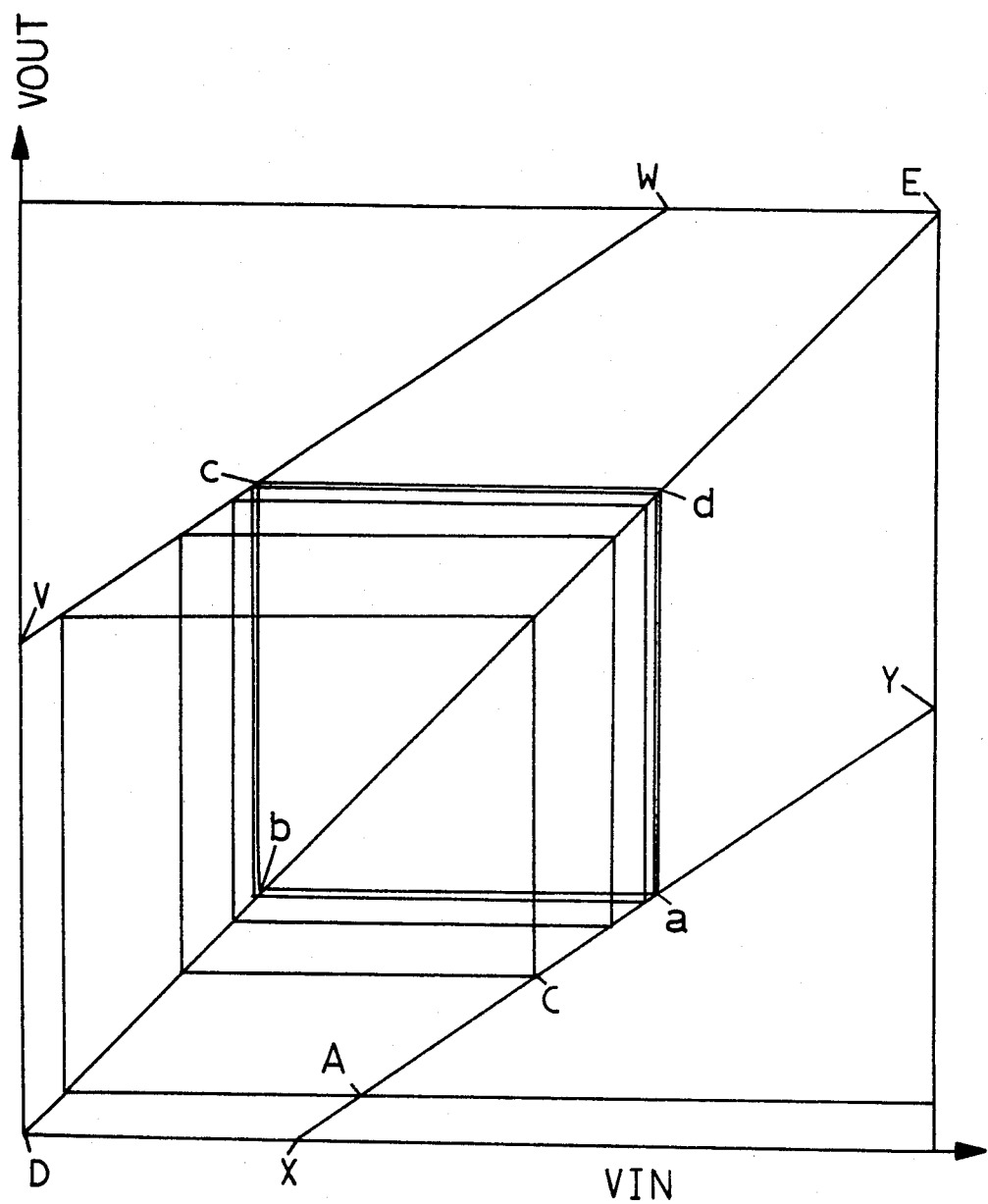
FIG. 16 is portions of both transfer curves displayed together.

FIG. 16 shows portions of the two transfer curves together. Each arranged so that they have the same "1" voltage range, to see if they would be compatible. For this we would expect a logic 0 level input to the p-permutator to generate a logic 0 level as output of the q-permutator i.e. we would expect point A and point C in FIG. 16 to be in the neighborhood of one another. It is understood that in this arrangement the output of the p-permutator is the input of the q-permutator and vice versa.

The equation for the saturated P-channel enhancement MOS device portion of the p-permutator transfer curve is $$y = a1^* x + b1.$$

and the saturated N-channel enhancement MOS device portion of the q-permutator transfer curve has the equation:

$$y = a2^*(x - b2).$$

The conditions for points A and C in FIG. 16 to coincide is:

$$a1^* a2 = 1 \text{ and } b1 = b2.$$

But, due to current conduction in the P-channel enhancement MOS device in the p-permutator and the N-channel enhancement MOS device in the q-permutator we have:

a1 less than 1 and a2 less than 1. Thus A and C will not coincide for all A on the line XY.

However, for every such pair of lines VW, XY there will be one stable situation, either within the voltage supply range or without, as shown by the square abcd in FIG. 16. a and c are the only two points on the two lines VW, XY that are equidistant from the diagonal DE. Proper p- and q-permutator compatible operation in this configuration requires two such stable squares: one for logic 0 input to the p-permutator with a logic 0 output from the q-permutator and another for logic 2 input to the q-permutator with a logic 2 output from the p-permutator. This is why p- and q-permutators cannot be operated together.

From the foregoing, it would be apparent that the present invention provides a system for ternary logic circuits that may take different forms in order to fulfill various requirements. When incorporated in large scale arrays comprising a multiplicity of gates in integrated circuit form, the fact that the circuit operates on a ternary logic basis rather than a conventional binary logic basis will provide substantial savings in chip area for interconnect and bus lines.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A three-level logic circuit comprising:
an MOS load device connected to a first voltage supply;
an input logic element comprised of at least one pair of P-channel and N-channel enhancement type complementary MOS devices and connected at a node to said load device and said element further connected to a second voltage supply at a different level;
logic input means to said input logic element and an output at said node;
wherein the absolute value of said N-channel MOS device threshold voltage is greater than the absolute value of said P-channel MOS device threshold voltage when said first voltage supply is algebraically greater that the said second voltage supply and conversely, the absolute value of said N-channel MOS device threshold voltage is less than the absolute value of said P-channel MOS device threshold voltage when said first voltage supply is algebraically less than said second voltage supply;
whereby inputs to said logic input means at three predetermined voltage levels will produce active logic outputs at three different voltage levels from said node.

2. The logic circuit described in claim 1 wherein said input logic element comprises an N-channel enhancement type MOS device and a complementary P-channel enhancement type MOS device having their drain-source current paths connected in parallel, said logic input being connected to the gate of said N-channel device and to the gate of said P-channel device whereby each logic input will produce a logic output that is different from the input and all three logic levels will be realized as outputs (FIGS. 1, 2, 3, 4).

3. The logic circuit described in claim 1 wherein said input logic element comprises two N-channel enhancement type MOS devices having their drain-source current paths connected in series between said node and one said second voltage supply with gates connected to first and second logic inputs, respectively, and two complementary P-channel enhancement type MOS devices having their drain-source current paths connected in series between said node and one said second voltage supply and with their gates respectively connected to said first and second logic inputs (FIGS. 5, 6, 11-6, 11-8).

4. The logic circuit described in claim 1 wherein said input logic element is comprised of a first complementary N-channel and P-channel enhancement type MOS devices having their gates connected to a first logic input and having their drain-source current paths connected between said node and an intermediate second node, and a second complementary N-channel and P-channel enhancement type MOS devices having their gates connected to a second logic input and having their drain-source current paths connected between said intermediate second node and one said second voltage supply (FIGS. 7, 8, 11-10).

5. The logic circuit described in claim 1 wherein said input logic element is comprised of first complementary N-channel and P-channel enhancement type MOS devices having their gates connected to a first logic input and having their drain-source current paths connected between said node and one second voltage supply, and second complementary N-channel and P-channel enhancement type MOS devices having their gates connected to a second logic input and also having their drain-source current paths connected between said node and one said second voltage supply (FIGS. 9, 10, 11-1).

6. The logic circuit described in claim 1 wherein said input logic element comprises a series connection of the drain-source current paths of a first N-channel enhancement type MOS device and a first P-channel enhancement type MOS device connected between said node and one said second voltage supply with their gates respectively connected to first and second logic inputs, and a series connection of the drain-source current paths of a second P-channel enhancement type MOS device and a second N-channel enhancement type MOS device between said node and one said second voltage supply with their gates respectively connected to said first and second logic inputs (FIGS. 11-7, 11-21, 11-23).

7. The logic circuit described in claim 1 wherein said input logic element comprises an N-channel enhancement type MOS device and a P-channel enhancement type MOS device having their drain-source current paths connected in series between said node and one said second voltage supply and having their gates connected to first and second logic inputs, respectively (FIGS. 11-13, 11-14, 11-15, 11-11, 11-22).

8. The logic circuit described in claim 1 wherein said input logic element comprises a pair of complementary MOS devices each connected between one said second voltage supply and said output node, one said complementary device receiving a first logic input and the other said complementary device receiving a second logic input (FIGS. 11-2, 4, 7, 9).

* * * * *

UNITED STATES PATENT AND TRADEMARK OFFICE
CERTIFICATE OF CORRECTION

PATENT NO. : 4,518,875

DATED : May 21, 1985

INVENTOR(S) : Haluk M. Aytac

It is certified that error appears in the above-identified patent and that said Letters Patent are hereby corrected as shown below:

Column 1, line 65, "4,280,065" should read --4,280,965--.
Column 2, line 13, "threreby" should read --thereby--.

Column 9, line 13, "on" should read --in--.
Column 10, lines 48-52, cancel these lines.
Column 10, lines 9-17, these lines should be moved and inserted in column 10, following line 47.
Column 10, following first chart, insert the following lines which have been omitted:

--Here, 2, 0 is used for binary logic instead of 1, 0 since in the example of this invention described herein, "2" denotes the voltage range closest to Vcc voltage which is what "1" customarily denotes in binary logic.--

Column 13, line 33, after "compatible" it should read --in a static RAM cell--.
Column 14, line 6, after "together" it should read --in a static RAM cell configuration--.
Column 16, line 13, "Figs. 11-7" should read --Figs. 11-17--.

Signed and Sealed this

Twenty-second Day of October 1985

[SEAL]

Attest:

DONALD J. QUIGG

*Attesting Officer*

*Commissioner of Patents and Trademarks—Designate*